(12) United States Patent
Chou et al.

(10) Patent No.: US 11,158,662 B2
(45) Date of Patent: *Oct. 26, 2021

(54) SEMICONDUCTOR IMAGE SENSOR

(71) Applicant: Taiwan Semiconductor Manufacturing Co., Ltd., Hsin-Chu (TW)

(72) Inventors: Keng-Yu Chou, Kaohsiung (TW); Chun-Hao Chuang, Hsinchu (TW); Chien-Hsien Tseng, Hsinchu (TW); Kazuaki Hashimoto, Zhubei (TW); Wei-Chieh Chiang, Yuanlin Township (TW); Cheng Yu Huang, Hsinchu (TW); Wen-Hau Wu, New Taipei (TW); Chih-Kung Chang, Zhudong Township (TW); Jhy-Jyi Sze, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/695,575

(22) Filed: Nov. 26, 2019

(65) Prior Publication Data

US 2020/0098801 A1 Mar. 26, 2020

Related U.S. Application Data

(63) Continuation of application No. 16/516,451, filed on Jul. 19, 2019, now Pat. No. 10,510,795, which is a
(Continued)

(51) Int. Cl.
H01L 27/146 (2006.01)

(52) U.S. Cl.
CPC ...... *H01L 27/1464* (2013.01); *H01L 27/1463* (2013.01); *H01L 27/14621* (2013.01);
(Continued)

(58) Field of Classification Search
CPC .......... H01L 27/1464; H01L 27/14621; H01L 27/14627; H01L 27/14629; H01L 27/1463; H01L 27/14636; H01L 27/14685
See application file for complete search history.

(56) References Cited

U.S. PATENT DOCUMENTS 10,153,319 B2  12/2018  Wen et al.
10,553,733 B2   2/2020  Huang et al.
(Continued)

FOREIGN PATENT DOCUMENTS

CN   105185800 A   12/2015
JP   2018088532 A   6/2018

OTHER PUBLICATIONS

Non-Final Office Action dated Jan. 11, 2019 for U.S. Appl. No. 16/005,857.
(Continued)

*Primary Examiner* — Fernando L Toledo
*Assistant Examiner* — Neil R Prasad
(74) *Attorney, Agent, or Firm* — Eschweiler & Potashnik, LLC

(57) ABSTRACT

The present disclosure, in some embodiments, relates to an integrated chip. The integrated chip has an image sensor within a substrate. A first dielectric has an upper surface that extends over a first side of the substrate and over one or more trenches within the first side of the substrate. The one or more trenches laterally surround the image sensor. An internal reflection structure arranged over the upper surface of
(Continued)

the first dielectric. The internal reflection structure is configured to reflect radiation exiting from the substrate back into the substrate.

20 Claims, 13 Drawing Sheets

Related U.S. Application Data continuation of application No. 16/005,857, filed on Jun. 12, 2018, now Pat. No. 10,367,023.

(52) U.S. Cl.
CPC .. *H01L 27/14625* (2013.01); *H01L 27/14627* (2013.01); *H01L 27/14629* (2013.01); *H01L 27/14636* (2013.01); *H01L 27/14685* (2013.01)

(56) References Cited

U.S. PATENT DOCUMENTS

| | | |
|---|---|---|
| 2014/0159184 A1 | 6/2014 | Lim |
| 2014/0264685 A1* | 9/2014 | Cheng ............... H01L 31/18 257/432 |
| 2015/0243805 A1* | 8/2015 | Chien ............. H01L 27/1464 257/432 |
| 2016/0099266 A1 | 4/2016 | Zheng et al. |
| 2017/0271383 A1 | 9/2017 | Lai et al. |
| 2018/0151615 A1 | 5/2018 | Wen et al. |
| 2018/0301494 A1* | 10/2018 | Park ............ H01L 27/14685 |
| 2018/0359434 A1* | 12/2018 | Tanaka ............... G02B 5/20 |
| 2019/0043901 A1* | 2/2019 | Honda ........... H01L 27/14627 |
| 2019/0067355 A1 | 2/2019 | Li et al. |

OTHER PUBLICATIONS

Notice of Allowance dated Jun. 5, 2019 for U.S. Appl. No. 16/005,857.
Non-Final Office Action dated Oct. 4, 2019 for U.S. Appl. No. 16/516,451.
Notice of Allowance dated Nov. 6, 2019 for U.S. Appl. No. 16/516,451.

* cited by examiner

SEMICONDUCTOR IMAGE SENSOR

REFERENCE TO RELATED APPLICATIONS

This Application is a Continuation of U.S. application Ser. No. 16/516,451, filed on Jul. 19, 2019, which is a Continuation of U.S. application Ser. No. 16/005,857, filed on Jun. 12, 2018 (now U.S. Pat. No. 10,367,023, issued on Jul. 30, 2019). The contents of the above-referenced patent applications are hereby incorporated by reference in their entirety.

BACKGROUND

Integrated circuits (IC) with image sensors are used in a wide range of modern day electronic devices. In recent years, complementary metal-oxide semiconductor (CMOS) image sensors have begun to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
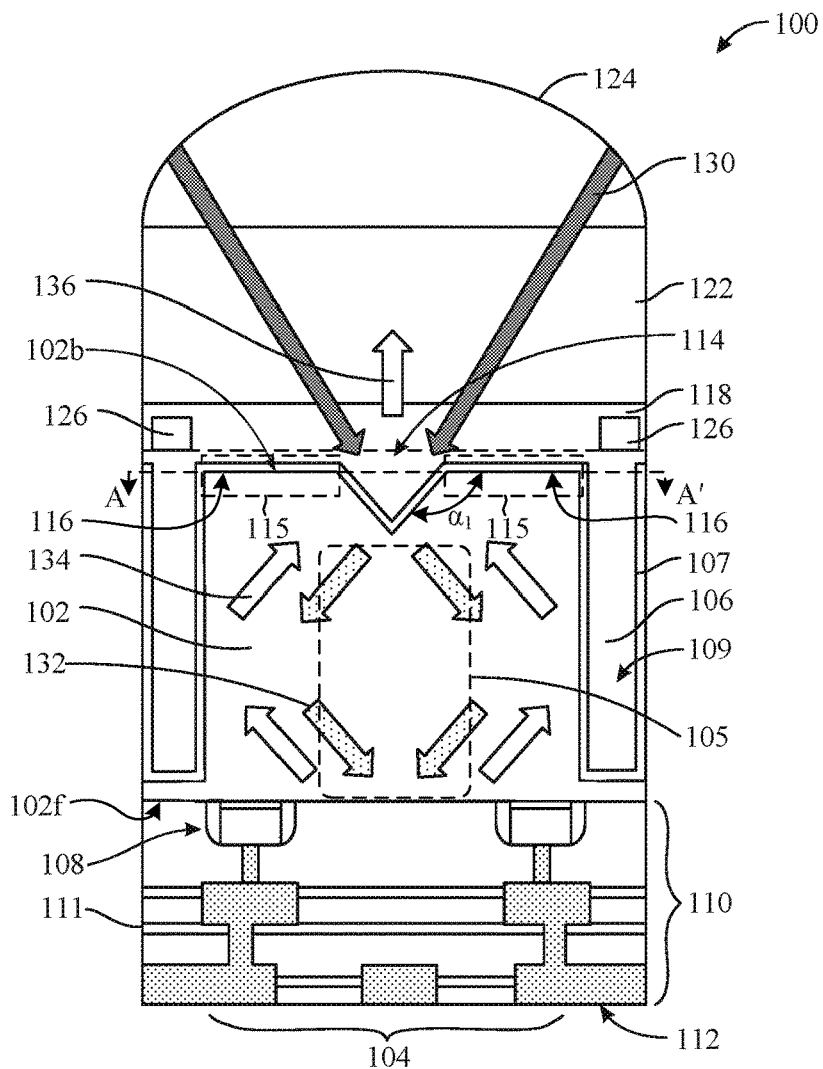
FIGS. 1A-1B illustrates some embodiments of an image sensor integrated chip having an internal reflection enhancement structure configured to reduce backscattered light from a pixel.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Back-side illuminated (BSI) image sensors represent a class of image sensors that arrange imaging elements to increase the amount of light captured and thereby improve performance. BSI sensors arrange the circuit electronics (e.g., transistors) behind the pixels by flipping a substrate during manufacturing and then thinning its reverse side so that light can strike the pixels without passing through the circuit electronics. However, for near-infrared radiation (NIR) BSI image sensors, due to low absorption in silicon, forward traveling NIR light in the BSI sensors can touch the circuit electronics at the front side of the BSI sensors. The NIR light can then reflect backward through the substrate. Accordingly, a portion of the reflected NIR light can reach the backside surface of the BSI sensor and escape out of the device to air, thereby decreasing a quantum efficiency of the BSI sensor.

The present disclosure, in some embodiments, relates to an image sensor integrated chip having an optical design configured to increase internal reflection of radiation, so as to reduce the amount of reflected NIR radiation that escapes out of the chip. The image sensor integrated chip comprises an image sensing element arranged within a substrate. One or more protrusions and/or recesses can be arranged along a first side of the substrate over the image sensing element. An internal reflection enhancement structure is also arranged along the first side of the substrate. The internal reflection enhancement structure is configured to reflect reflected NIR radiation back into the substrate. In various embodiments, the disclosure enables the NIR radiation to be reflected back and forth within the substrate including the image sensing element to increase the quantum efficiency (QE) of the device.

Figure 1B:
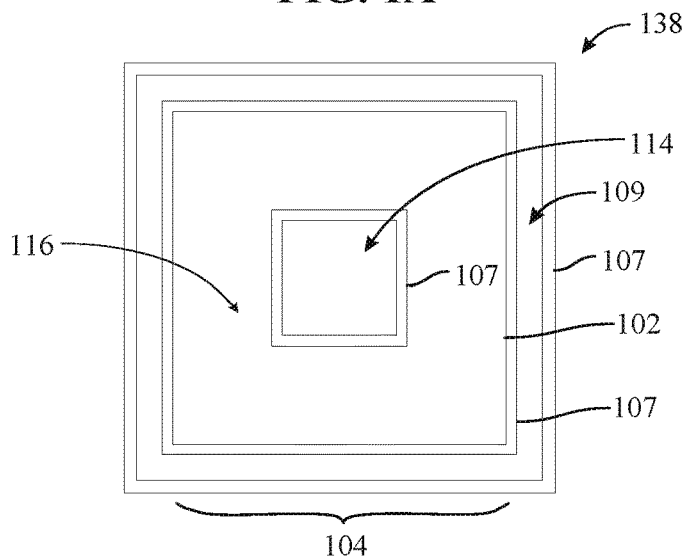

FIG. 1A illustrates a cross-sectional view of some embodiments of an image sensor integrated chip 100 having an internal reflection enhancement structure configured to reduce backscattered light from a pixel. FIG. 1B illustrates a top-view 138 of the image sensor integrated chip of FIG. 1A, shown along cross-sectional line A-A'.

The image sensor integrated chip 100 comprises a substrate 102 having a pixel region 104. In an embodiment, the substrate 102 may comprise silicon or another semiconductor material. The substrate 102 has a first side 102f and a second side 102b. In some embodiments, the first side 102f may be a front-side of the substrate 102 and the second side 102b may be a back-side of the substrate 102. The pixel region 104 can comprise an image sensing element 105 configured to convert incident radiation (e.g., photons) into an electric signal (i.e., to generate electron-hole pairs from the incident radiation). In some embodiments, the image sensing element 105 may comprise a photodiode.

In an embodiment, the image sensor integrated chip 100 can include transistor devices 108. The transistor devices 108 can be arranged along the first side 102f of the substrate 102. In various embodiments, the transistor devices 108 can include one or more transistor gate structures that may correspond to a transfer transistor, a source-follower transistor, a row select transistor, and/or a reset transistor.

In some embodiments, a dielectric structure 110 is also arranged along the first side 102f of the substrate 102. The dielectric structure 110 surrounds a plurality of conductive interconnect layers 112. In some embodiments, the dielectric structure 110 comprises a plurality of stacked inter-level dielectric (ILD) layers. The plurality of conductive interconnect layers 112 comprise alternating layers of conductive vias and conductive wires, which are arranged within the stacked ILD layers and electrically coupled to the plurality of transistor devices 108. In some embodiments, etch stop layers 111 may be arranged between adjacent ones of the plurality of ILD layers. In various embodiments, the plurality of conductive interconnect layers 112 may comprise tungsten, copper, or aluminum copper, for example.

In some embodiments, a first dielectric 109 may be disposed within one or more trenches 106 defined by interior surfaces of the substrate 102. In various embodiments, the first dielectric 109 can include an oxide (e.g., silicon dioxide) or a nitride (e.g., silicon nitride). In one aspect, the first dielectric 109 can be disposed in trenches 106 on opposing sides of the pixel region 104.

The image sensor integrated chip 100 can include a recess 114 within the second side 102b of substrate 102. In some embodiments, the recess 114 may comprise a single recess within the pixel region 104. The second side 102b of the substrate 102 comprises a non-planar surface defining the recess 114, which is arranged between an internal reflection enhancement structure 115 comprising substantially flat surfaces 116 of the substrate 102. In some embodiments, the substantially flat surfaces 116 extend between the recess 114 and the one or more trenches 106. In some embodiments, the recess 114 may comprise angled sidewalls. In an embodiment, the angled sidewall of the recess 114 can form an angle α₁ of approximately 45 degrees to approximately 55 degrees with respect to the second side 102b of the substrate 102.

In one embodiment, one or more absorption enhancement layers 107 can be arranged over the recess 114. In an embodiment, the one or more absorption enhancement layers 107 can include a high-k material. In another embodiment, the one or more absorption enhancement layers 107 can include an oxide material, for example, a hafnium oxide material, a titanium oxide material, or the like. In another embodiment, the one or more absorption enhancement layers 107 can include a material having an index of refraction of approximately 2. One of the one or more absorption enhancement layers 107 contact the substrate 102 along the second side 102b of the substrate 102 and the sidewalls of the substrate 102 to increase absorption of radiation by the substrate 102 (e.g., by reducing a reflection of radiation from the second side 102b of the substrate 102). Increasing absorption of radiation by the substrate 102 increases a quantum efficiency (QE) of the image sensing element and can improve performance of the image sensor integrated chip 100.

In one embodiment, the image sensor integrated chip 100 can include grid elements 126 which can be part of a grid structure. In an embodiment, the image sensor integrated chip 100 can include grid elements 126 that are comprised of metal. The grid elements 126 can be disposed over or within a second dielectric 118. The grid elements 126 may comprise a metal (e.g., aluminum, cobalt, copper, silver, gold, tungsten, etc.) and/or a dielectric material (e.g., $SiO_2$, SiN, etc.). In another embodiment, the second dielectric 118 can include an oxide.

In one embodiment, the image sensor integrated chip 100 can include a color filter 122. In another aspect, the color filter 122 can be arranged on the second dielectric 118. The color filter 122 can be configured to transmit specific wavelengths of incident radiation. For example, a first color filter may transmit radiation having wavelengths within a first range (e.g., corresponding to green light), while reflecting radiation having wavelengths within a second range (e.g., corresponding to red light) different than the first range, etc. A micro-lens 124 may be arranged over the color filter 122 and laterally aligned with the color filter 122 and overlying the pixel regions 104.

During operation, the micro-lens 124 is configured to focus the incident radiation 130 (e.g., light) towards the recess 114. For incident radiation 130 striking the substrate 102 at an angle of incidence greater than a critical angle, the angled sidewalls of the recess 114 and/or the one or more absorption enhancement layers 107 may act to reflect the incident radiation 130 to within the recess 114, where a portion of the incident radiation 132 can strike another surface of the substrate 102 and subsequently enter into the substrate 102. A reflected portion 134 of the incoming incident radiation 132 can be reflected within the substrate 102 (e.g., by the plurality of conductive interconnect layers 112). The reflected portion 134 of the incoming incident radiation 132 strikes the substantially flat surfaces 116 of the substrate 102 along opposing sides of the recess 114. The flat surfaces 116 increase internal reflection of the reflected portion 134 (e.g., by causing the reflected portion to strike the surfaces at an angle that is greater than a critical angle), so as to decrease the amount of backscattered light 136 exiting out of the substrate 102. By increasing the internal reflection of the reflected portion 134 the substrate 102 is able to absorb more radiation, thereby increasing a quantum efficiency of the image sensor integrated chip 100.

Figure 2:
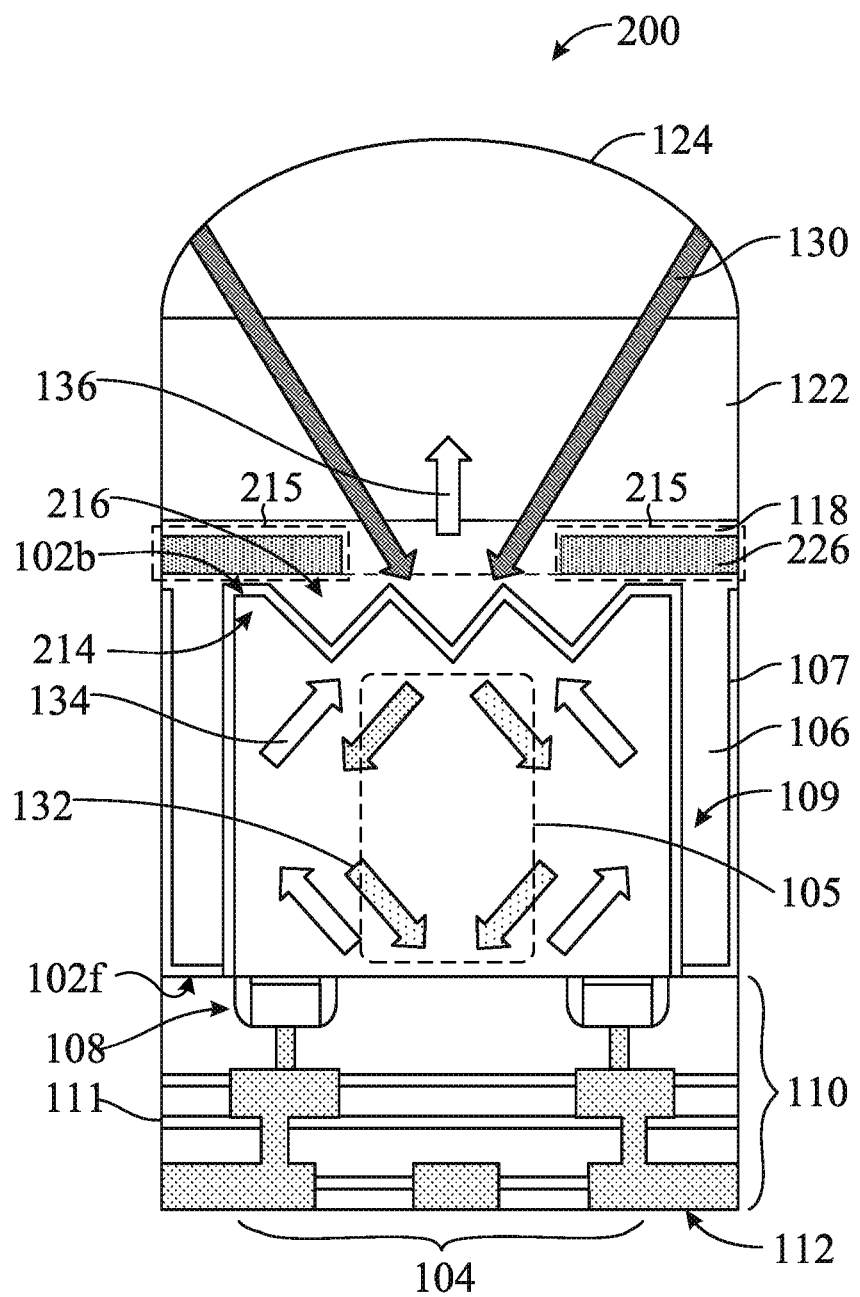
FIG. 2 illustrates a cross-sectional view of an additional embodiment of an image sensor integrated chip having an internal reflection enhancement structure comprising reflective elements.

FIG. 2 shows an additional embodiment of an image sensor integrated chip 200 having an internal reflection enhancement structure comprising reflective elements.

In an embodiment, the image sensor integrated chip 200 can include a plurality of recesses 214 arranged along a second side 102b of a substrate 102. The plurality of recesses 214 can be arranged in a periodic pattern. In an embodiment, the plurality of recesses 214 can alternatively be referred to herein as a diffuser. In an embodiment, the image sensor integrated chip 200 can further include a plurality of protrusions 216 within the second side 102b of the substrate 102.

In an embodiment, the image sensor integrated chip 200 can include an internal reflection enhancement structure 215 comprising reflective elements 226 arranged along the second side 102b of the substrate 102. The reflective elements 226 may be arranged between a first dielectric 109 and a second dielectric 118.

In an embodiment, the reflective elements 226 can cover a portion of the plurality of recesses 214 and the plurality of protrusions 216. In another embodiment, the reflective elements 226 may comprise one or more separate reflective regions. The one or more reflective regions may comprise materials selected to provide for a good QE at different wavelengths of electromagnetic radiation. In some embodiments, the one or more reflective regions may comprise a conductive material. For example, the one or more reflective regions may comprise metals such as aluminum (Al), rhodium (Rh), ruthenium (Ru), copper (Cu), silver (Ag), gold (Au), tungsten (W), cobalt (Co), iron (Fe), molybdenum (Mo), titanium (Ti), chromium (Cr). In some embodiments, the one or more reflective regions comprise different materials. For example, a first reflective region may comprise aluminum and an adjacent reflective region may comprise tungsten. In other embodiments, one of the one or more reflective regions may comprise an air gap filled with a gas (e.g., oxygen, nitrogen, etc.). The air gap can provide the image sensor integrated chip 200 with a good QE within the near infrared (NIR) region of the electromagnetic spectrum (e.g., in a range of wavelengths between approximately 600 nm and approximately 940 nm). This is because the air gap reflects NIR radiation while having a relatively low absorption of NIR radiation (i.e., having a lower absorption of NIR radiation than a metal).

In some embodiments, the reflective elements 226 may extend outward from the first dielectric 109, so that an uppermost surface of the reflective elements 226 overlies an uppermost surface of the first dielectric 109. For example, the reflective elements 226 may extend above the uppermost surface of the first dielectric 109 by a non-zero distance. In some embodiments, the reflective elements 226 may not extend outward past an uppermost surface of the second dielectric 118. For example, in various embodiments, the reflective elements 226 may have an uppermost surface that is substantially co-planar with or that is recessed below the uppermost surface of the second dielectric 118. In another embodiment, the reflective elements 226 can have a thickness ranging from approximately 300 angstroms to approximately 5,000 angstroms.

The reflective elements 226 are configured to increase internal reflection of the reflected portion 134, so as to decrease the amount of backscattered light 136 exiting out of the substrate 102. By increasing the internal reflection of the reflected portion 134 the substrate 102 is able to absorb more radiation, thereby increasing a quantum efficiency of the image sensor integrated chip 200.

Figure 3:
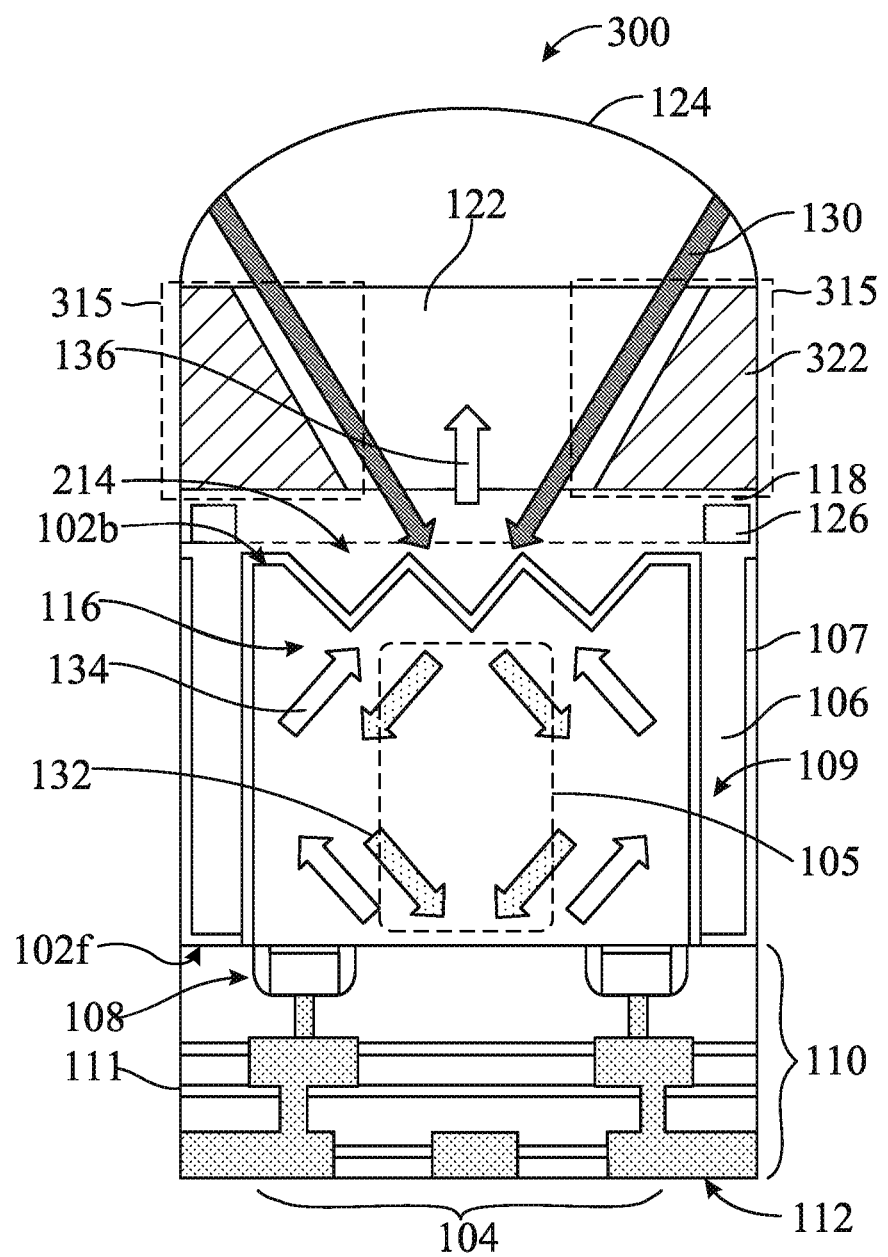
FIG. 3 illustrates a cross-sectional view of some embodiments of an image sensor integrated chip having an internal reflection enhancement structure comprising a low index material reflective element.

FIG. 3 illustrates a cross-sectional view of some embodiments of an image sensor integrated chip 300 having an internal reflection enhancement structure comprising low index material reflective element.

In an embodiment, the image sensor integrated chip 300 can include an internal reflection enhancement structure 315 comprising a low index material reflective element 322 disposed on a first dielectric 109. The low index material reflective element 322 comprises an index of refraction that is less than that of the first dielectric 109. For example, in some embodiments, the low index material reflective element may have an index of refraction that is less than approximately 1.5. In some additional embodiments, the low index material reflective element may have an index of refraction that is less than approximately 1.4. Because the low index material reflective element 322 comprises an index of refraction that is less than that of the first dielectric 109, the low index material reflective elements 322 will reflect radiation (e.g., near infrared radiation (NIR)) that is exiting from the substrate 102 back towards the substrate 102.

In an embodiment, the low index material reflective elements 322 can be arranged along opposing sidewalls of a color filter 122. In an embodiment, the low index material reflective element 322 can include a low index material such as an organic material or a dielectric material. In some embodiments, the low index material reflective element 322 can have the same thickness as the color filter 122. In another embodiment, the low index material reflective element 322 can have a thickness ranging from approximately 300 angstroms to approximately 50,000 angstroms.

In some embodiments, the low index material reflective elements 322 may have angled sidewalls that define an opening over one or more of a plurality of recesses 214 within a second side 102b of the substrate 102. The opening decreases in width as a distance from the one or more of a plurality of recesses 214 decreases. By having the angled sidewall define an opening in the low index material reflective elements 322, the low index material reflective elements 322 can increase the amount of radiation that goes into the substrate 102.

Figure 4:
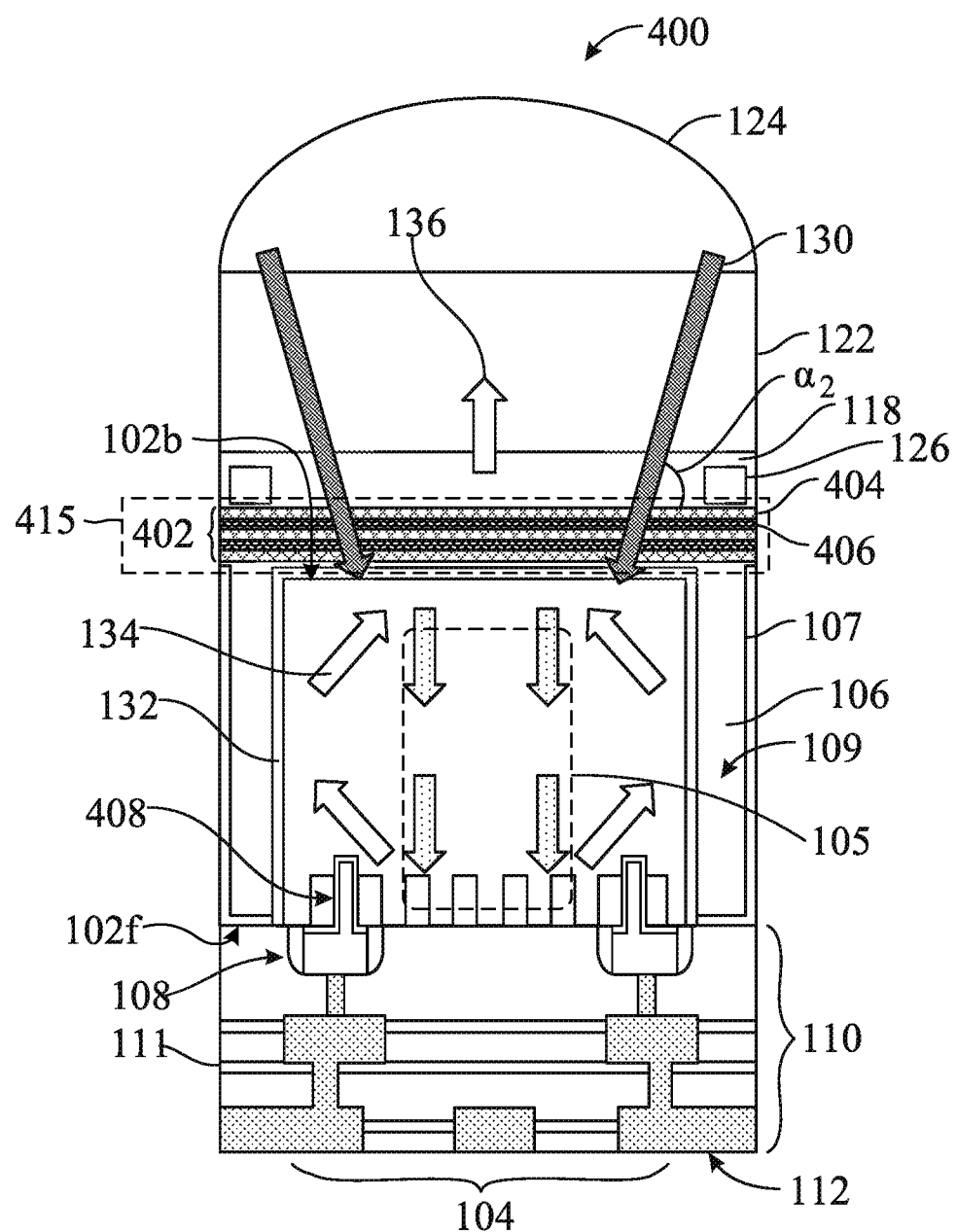
FIG. 4 illustrates a cross-sectional view of some embodiments of an image sensor integrated chip having an internal reflection enhancement structure comprising a multi-layer reflective structure.

FIG. 4 illustrates a cross-sectional view of some embodiments of an image sensor integrated chip 400 having an internal reflection enhancement structure comprising a multi-layer reflective structure on a backside of a substrate.

In an embodiment, the image sensor integrated chip 400 can include an internal reflection enhancement structure 415 comprising a multi-layer structure 402 is configured to reduce back scattered radiation, for example, NIR radiation, from the substrate 102. In an embodiment, the image sensor integrated chip 400 can include a multi-layer structure 402. In another embodiment, the multi-layer structure 402 can have angular selectivity with respect to the incident NIR. For example, the multi-layer structure 402 may allow radiation traveling towards the substrate 102 to pass through the multi-layer structure 402 over a first range of angles, and to further allow radiation traveling away from the substrate 102 to pass through the multi-layer structure 402 over a second range of angles that is different than the first range of angles.

In an embodiment, the multi-layer structure 402 can include a first material 404. In another embodiment, the multi-layer structure 402 can include a second material 406. In one embodiment, the first material 404 can include a dielectric material having a relatively high index of refraction, with respect to the second material 406. In another embodiment, the second material 406 can include a dielectric material having a lower index of refraction with respect to the first material 404. In an embodiment, the first material 404 can include a titanium oxide material. In another embodiment, the second material 406 can include a second oxide material, for example a silicon oxide material. In one embodiment, the multi-layer structure 402 can have a thickness ranging between approximately 1,000 angstroms to approximately 10,000 angstroms.

In an embodiment, the image sensor integrated chip 400 can have a plurality of shallow trench isolation (STI) structures 408 along the first side 102f of the substrate 102. In an embodiment, the plurality of STI structures 408 can include a periodic array of trenches along the first side 102f of the substrate 102. In an embodiment, the plurality of STI structures 408 can serve as a diffuser on the first side 102f of the substrate 102. In an embodiment, the plurality of STI structures 408 can comprise a periodic structure having a substantially rectangular shape. In another embodiment, the plurality of STI structures 408 can have another shape, for example a triangular shape, arranged in a periodic fashion, along the first side 102f of the substrate 102.

FIGS. 5A-8G illustrate cross-sectional views of some embodiments of a method of forming an image sensor integrated chip, in accordance with example embodiments of the disclosure. Although FIGS. 5A-8G are described with reference to a method, it will be appreciated that the structures shown in FIGS. 5A-8G are not limited to the method but rather may stand alone separate of the method.

FIG. 5A-5F illustrate cross-sectional views of some embodiments of a method of forming an image sensor integrated chip with reduced backscattering of incident radiation, for example, near-infrared radiation (NIR).

Figure 5A:
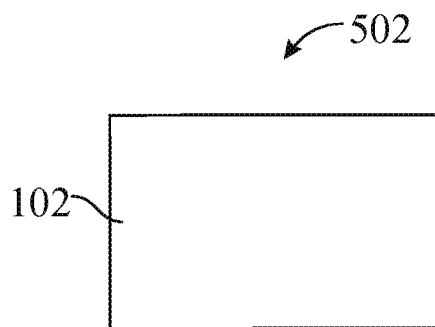
FIGS. 5A-8G illustrate cross-sectional views of some embodiments of methods of forming an image sensor integrated chip with reduced backscattering of incident radiation.

FIG. 5A shows a cross-sectional view 502 of a portion of an image sensor integrated chip. As shown in cross-sectional view 502, the portion of the image sensor integrated chip includes a substrate 102. The substrate 102 may be any type of semiconductor body (e.g., silicon, SiGe, SOI, etc.), as well as any other type of semiconductor and/or epitaxial layers, associated therewith. For example, in some embodiments, the substrate 102 may comprise a base substrate and an epitaxial layer. In some embodiments, the substrate 102 may be thinned to allow for radiation to pass more easily to image sensing elements within the substrate 102. In various embodiments, the substrate 102 may be thinned by etching and/or mechanical grinding the substrate 102. In an embodiment, the substrate 102 may have an initial thickness of approximately 10 micrometers and be thinned to approximately 6 to approximately 8 micrometers upon thinning.

Figure 5B:
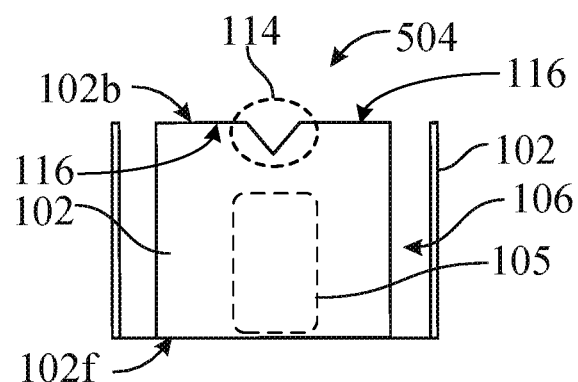

FIG. 5B shows another cross-sectional view 504 of a portion of an image sensor integrated chip. As shown in cross-sectional view 504, a recess 114 is formed within a second side 102b of the substrate 102. In an embodiment, the recess 114 can serve as a diffuser of incident light on the substrate 102. In some embodiments, trenches 106 may also be formed in the second side 102b of the substrate 102. The trenches 106 are defined by sidewalls and/or a lower surface of the substrate 102. Substantially flat surfaces 116 extend between the recess 114 and the trenches 106. In some embodiments, the recess 114 may comprise a single recess arranged between the substantially flat surfaces 116.

In some embodiments, the recess 114 and the trenches 106 may be formed by selectively etching a second side 102b of the substrate 102 according to a patterned masking layer (not shown) formed along the second side 102b of a substrate 102. The patterned masking layer comprises sidewalls defining openings arranged over the substrate 102. In some embodiments, the patterned masking layer may be formed by depositing a layer of photosensitive material (e.g., a positive or negative photoresist) over the substrate 102. The layer of photosensitive material is selectively exposed to electromagnetic radiation according to a photomask. The electromagnetic radiation modifies a solubility of exposed regions within the photosensitive material to define soluble regions. The photosensitive material is subsequently developed to define openings within the photosensitive material by removing the soluble regions.

Additionally, an etching process can be performed on the second side 102b of the substrate 102 according to the patterned masking layer. The etching process is performed by exposing the substrate 102 to one or more etchants with the patterned masking layer in place. The one or more etchants can remove parts of the substrate 102 to define a recess defining a recess 114 into the substrate 102. In some embodiments, the etching process may comprise a dry etching process. For example, the etching process may comprise a coupled plasma etching process, such as an inductively coupled plasma (ICP) etching process or a capacitively coupled plasma (CCP) etching process. In other embodiments, the etching process may comprise a wet etching process.

Additionally, image sensing elements 105 can be formed within a pixel region of the substrate 102. In some embodiments, the image sensing elements 105 may comprise photodiodes formed by implanting one or more dopant species into a first side 102f of the substrate 102. For example, the photodiodes may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

Figure 5C:
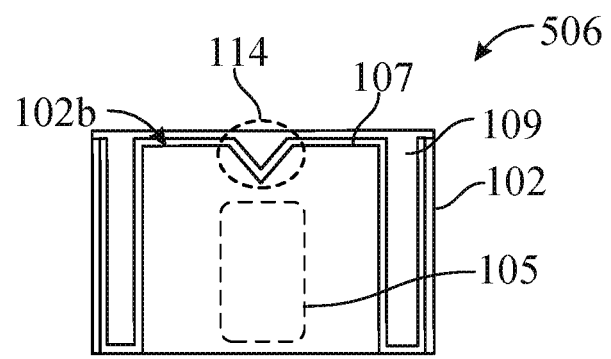

FIG. 5C shows another cross-sectional view 506 of a portion of an image sensor integrated chip. As shown in cross-sectional view 506, a first dielectric 109 is formed over the second side 102b of the substrate 102 and within the trenches 106. In some embodiments, the first dielectric 109 can include an oxide (e.g., silicon oxide), TEOS, etc. In some embodiments, the first dielectric 109 may cover the recess 114 and fill the trenches 106. The first dielectric 109 may undergo a subsequent planarization process (e.g., a chemical mechanical planarization process) to form a substantially planar surface.

In an embodiment, one or more absorption enhancement layers 107 may be formed along the second side 102b of the substrate 102. In another embodiment, the one or more absorption enhancement layers 107 can include an anti-reflective material. The anti-reflective material may line the second side 102b of the substrate 102, including the recess 114. In some embodiments, the anti-reflective material may further line interior surfaces of the trenches 106. In some embodiments, the anti-reflective material may comprise a high-k dielectric material including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), etc. In some embodiments, the anti-reflective material may be deposited by a physical vapor deposition technique (e.g., PVD, CVD, PE-CVD, ALD, etc.).

Figure 5D:
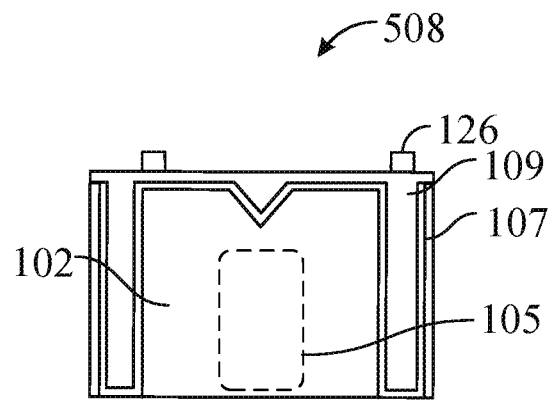

FIG. 5D shows another cross-sectional view 508 of a portion of an image sensor integrated chip. As shown in cross-sectional view 508, grid elements 126 are formed over the first dielectric 109. The grid elements 126 can include a metal (e.g., aluminum, cobalt, copper, silver, gold, tungsten, etc.) and/or a dielectric material (e.g., $SiO_2$, SiN, etc.). In some embodiments, the grid elements 126 may be deposited by a physical vapor deposition technique (e.g., PVD, CVD, PE-CVD, ALD, etc.).

Figure 5E:
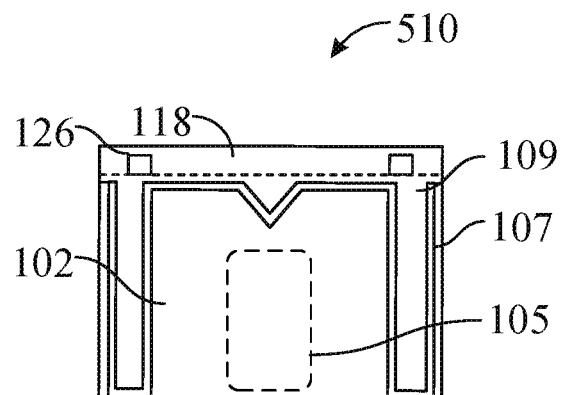

FIG. 5E shows another cross-sectional view 510 of a portion of an image sensor integrated chip. As shown in cross-sectional view 510, a second dielectric 118 is formed over the first dielectric 109 and the grid elements 126. In another embodiment, the second dielectric 118 can include an oxide (e.g., silicon oxide), TEOS, etc. In some embodiments, the second dielectric 118 may undergo a subsequent planarization process (e.g., a chemical mechanical planarization process) to form a substantially planar surface.

Figure 5F:
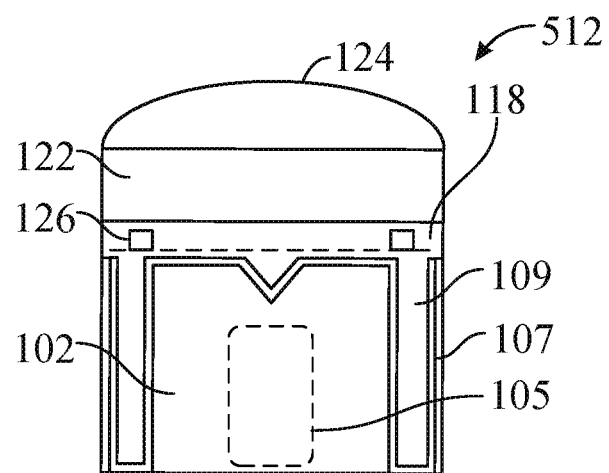

FIG. 5F shows another cross-sectional view 512 of a portion of an image sensor integrated chip. As shown in cross-sectional view 512, a color filter 122 is formed over the second dielectric 118. The color filter 122 is formed of a material that allows for the transmission of radiation (e.g., light) having a specific range of wavelength, while blocking light of wavelengths outside of the specified range.

In another embodiment, a micro-lens 124 may be formed over the color filter 122. In some embodiments, micro-lens 124 may be formed by depositing a micro-lens material above the color filter 122 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lens 124 can then be formed by selectively etching the micro-lens material according to the micro-lens template.

FIGS. 6A-6G illustrate cross-sectional views of some embodiments of a method of forming an image sensor integrated chip with reduced backscattering of incident radiation, for example, near-infrared radiation (NIR).

Figure 6A:
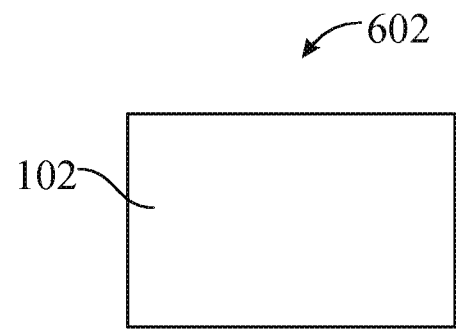

FIG. 6A shows a cross-sectional view 602 of a portion of an image sensor integrated chip. As shown in cross-sectional view 602, the portion of the image sensor integrated chip can include a substrate 102. The substrate 102 can include a silicon material or another semi-conductor material. In some embodiments, the substrate 102 may be thinned to allow for radiation to pass more easily to image sensing elements within the substrate 102. In various embodiments, the substrate 102 may be thinned by etching and/or mechanical grinding the substrate 102.

Figure 6B:
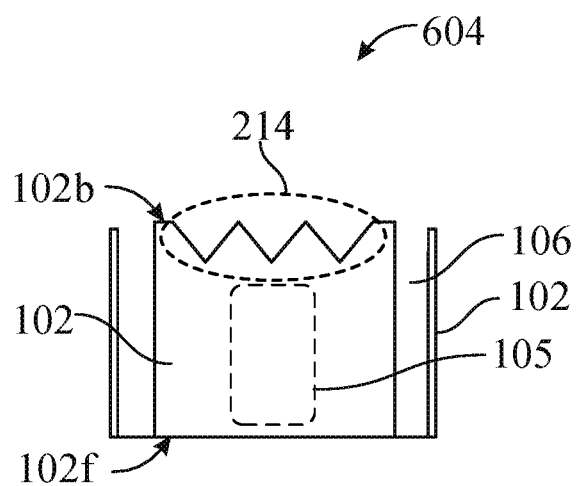

FIG. 6B shows another cross-sectional view 604 of a portion of an image sensor integrated chip. As shown in cross-sectional view 604, a plurality of recesses 214 may be formed along a second side 102b of the substrate 102. In another embodiment, the plurality of recesses 214 can serve as a diffuser of incident radiation on the substrate 102. In an embodiment, trenches 106 may also be formed within the second side 102b of the substrate 102.

In some embodiments, the plurality of recesses 214 may be formed by performing an etching process on a second side 102b of the substrate 102 according to a patterned masking layer. The etching process is performed by exposing the substrate 102 to one or more etchants with a patterned masking layer in place. The one or more etchants remove parts of the substrate 102 to define a plurality of recesses 214. The one or more etchants can further remove parts of the substrate 102 to define the trenches 106 within the substrate 102. In some embodiments, the etching process may comprise a dry etching process. For example, the etching process may comprise a coupled plasma etching process, such as an inductively coupled plasma (ICP) etching process or a capacitively coupled plasma (CCP) etching process. In other embodiments, the etching process may comprise a wet etching process.

Additionally, image sensing elements 105 can be formed within pixel regions of the substrate 102. In some embodiments, the image sensing elements 105 may comprise photodiodes formed by implanting one or more dopant species into a first side 102f of the substrate 102.

Figure 6C:
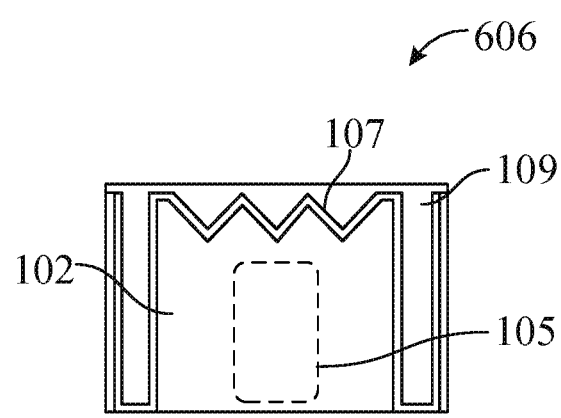

FIG. 6C shows another cross-sectional view 606 of a portion of an image sensor integrated chip. As shown in cross-sectional view 606, a first dielectric 109 is formed over the second side 102b of the substrate 102 and within the trenches 106. In another embodiment, the first dielectric 109 can include an oxide (e.g., silicon oxide), TEOS, etc. In some embodiments, the first dielectric 109 may extend within adjacent ones of the plurality of recesses 214 and fill the trenches 106. The first dielectric 109 may undergo a subsequent planarization process (e.g., a chemical mechanical planarization process) to form a substantially planar surface.

In another embodiment, one or more absorption enhancement layers 107 may be formed along the second side 102b of the substrate 102. In another embodiment, the one or more absorption enhancement layers 107 can include an anti-reflective material. The anti-reflective material lines the second side 102b of the substrate 102, including the plurality of recesses 214. In some embodiments, the anti-reflective material may further line interior surfaces of the trenches 106. In some embodiments, the anti-reflective material may comprise a high-k dielectric material deposited by a physical vapor deposition technique (e.g., PVD, CVD, PE-CVD, ALD, etc.).

Figure 6D:
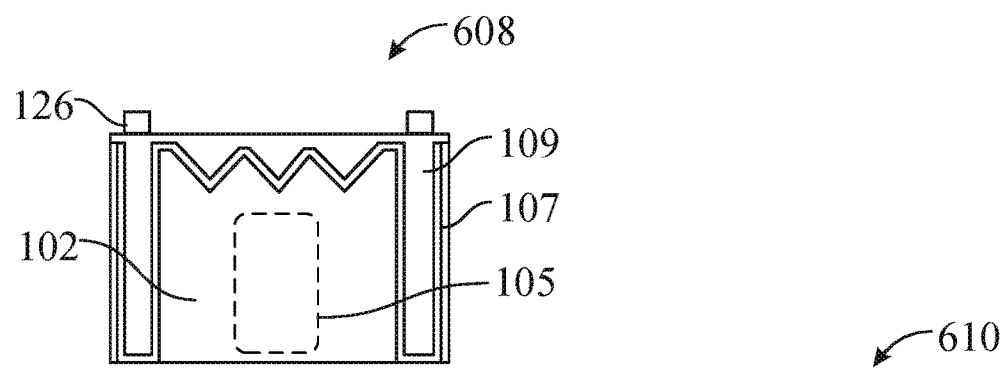

FIG. 6D shows another cross-sectional view 608 of a portion of an image sensor integrated chip. As shown in cross-sectional view 608, grid elements 126 are formed over the first dielectric 109. In another embodiment, the grid elements 126 can include a metal (e.g., aluminum, cobalt, copper, silver, gold, tungsten, etc.) and/or a dielectric material (e.g., $SiO_2$, SiN, etc.). In some embodiments, the grid elements 126 may be deposited by a physical vapor deposition technique (e.g., PVD, CVD, PE-CVD, ALD, etc.).

Figure 6E:
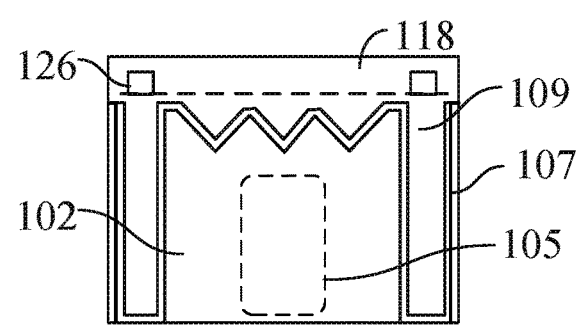

FIG. 6E shows another cross-sectional view 610 of a portion of an image sensor integrated chip. As shown in cross-sectional view 610, a second dielectric 118 is formed over the first dielectric 109 and the grid elements 126. In another embodiment, the second dielectric 118 can include an oxide (e.g., silicon oxide), TEOS, etc. In some embodiments, the second dielectric 118 may undergo a subsequent planarization process (e.g., a chemical mechanical planarization process) to form a substantially planar surface.

Figure 6F:
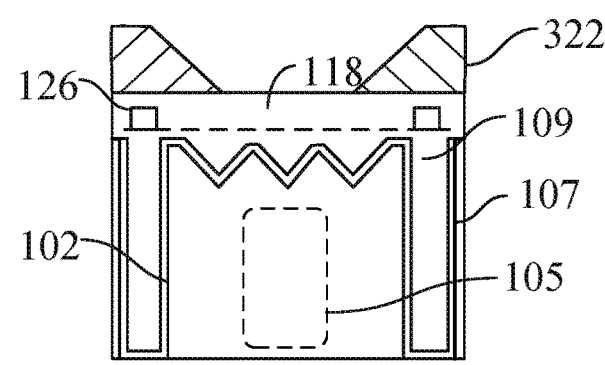

FIG. 6F shows another cross-sectional view 612 of a portion of an image sensor integrated chip. As shown in cross-sectional view 612, a low index material reflective element 322 is formed over the second dielectric 118. In an embodiment, the low index material reflective element 322 can include a low index material such as an organic material or a dielectric material. In some embodiments, the low index material reflective element 322 may be deposited by a physical vapor deposition technique (e.g., PVD, CVD, PE-CVD, ALD, etc.).

Figure 6G:
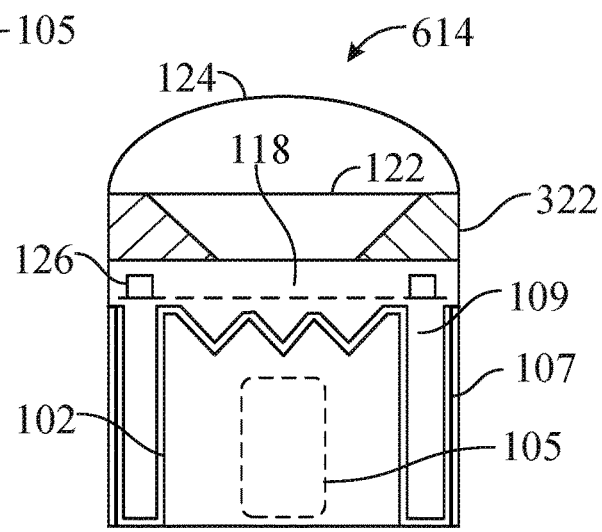

FIG. 6G shows another cross-sectional view 614 of a portion of an image sensor integrated chip. As shown in cross-sectional view 614, a color filter 122 is formed over the second dielectric 118 and between sidewalls of the low index material reflective element 322. The color filter 122 is formed of a material that allows for the transmission of radiation (e.g., light) having a specific range of wavelength, while blocking light of wavelengths outside of the specified range. In some embodiment, the low index material reflective element 322 can have the same thickness as the color filter 122. A micro-lens 124 may be formed onto the color filter 122 and the low index material reflective element 322.

FIGS. 7A-7E illustrate cross-sectional views of some embodiments of a method of forming an image sensor integrated chip with reduced backscattering of incident radiation, for example, near-infrared radiation (NIR).

Figure 7A:
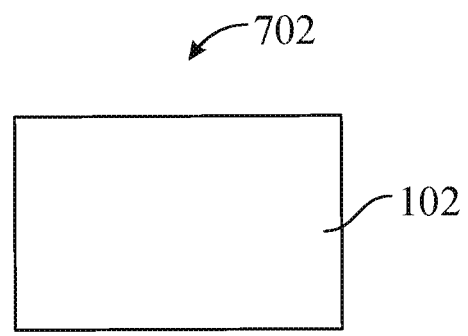

FIG. 7A shows a cross-sectional view 702 of a portion of an image sensor integrated chip. As shown in cross-sectional view 702, the portion of the image sensor integrated chip can include a substrate 102. The substrate 102 can include a silicon material or another semi-conductor material. In some embodiments, the substrate 102 may be thinned to allow for radiation to pass more easily to image sensing elements within the substrate 102. In various embodiments, the substrate 102 may be thinned by etching and/or mechanical grinding the substrate 102.

Figure 7B:
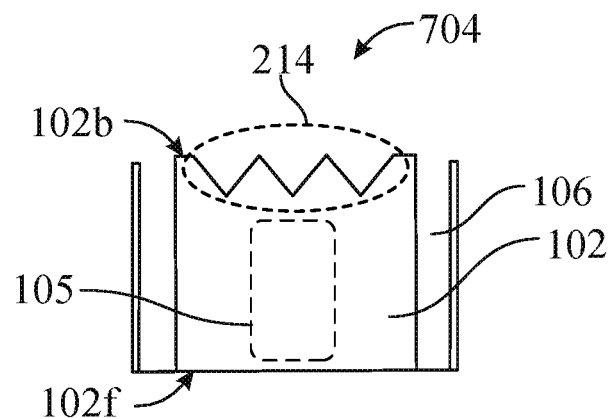

FIG. 7B shows another cross-sectional view 704 of a portion of an image sensor integrated chip. As shown in cross-sectional view 704, a plurality of recesses 214 may be formed along a second side 102b of the substrate 102. In another embodiment, the plurality of recesses 214 can serve as a diffuser of incident radiation on the substrate 102, for example, near-infrared radiation (NIR) on the substrate 102. In an embodiment, the portion of the image sensor integrated chip can include trenches 106.

In some embodiments, the plurality of recesses 214 may be formed by performing an etching process on a second side 102b of the substrate 102 according to the patterned masking layer. The etching process is performed by exposing the substrate 102 to one or more etchants with the patterned masking layer in place. The one or more etchants remove parts of the substrate 102 to define a plurality of recesses 214. The one or more etchants can further remove parts of the substrate 102 to define trenches 106 within the substrate 102. In some embodiments, the etching process may comprise a dry etching process. For example, the etching process may comprise a coupled plasma etching process, such as an inductively coupled plasma (ICP) etching process or a capacitively coupled plasma (CCP) etching process. In other embodiments, the etching process may comprise a wet etching process.

Additionally, image sensing elements 105 can be formed within pixel regions of the substrate 102. In some embodiments, the image sensing elements may comprise photodiodes formed by implanting one or more dopant species into a first side 102f of the substrate 102.

Figure 7C:
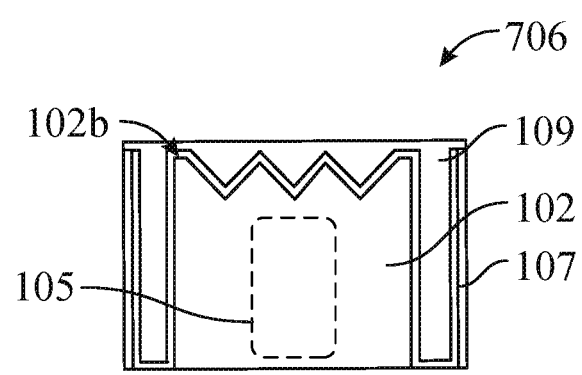

FIG. 7C shows another cross-sectional view 706 of a portion of an image sensor integrated chip. As shown in cross-sectional view 706, a first dielectric 109 is formed over the second side 102b of the substrate 102 and within the trenches 106. In another embodiment, the first dielectric 109 can include an oxide (e.g., silicon oxide), TEOS, etc. In some embodiments, the first dielectric 109 may extend within adjacent ones of the plurality of recesses 214 and fill the trenches 106. The first dielectric 109 may undergo a subsequent planarization process (e.g., a chemical mechanical planarization process) to form a substantially planar surface.

In another embodiment, one or more absorption enhancement layers 107 may be formed along the second side 102b of the substrate 102. In another embodiment, the one or more absorption enhancement layers 107 can include an anti-reflective material. The anti-reflective material lines the second side 102b of the substrate 102, including the plurality of recesses 214. In some embodiments, the anti-reflective material may further line interior surfaces of the trenches 106. In some embodiments, the anti-reflective material may comprise a high-k dielectric material deposited by a physical vapor deposition technique (e.g., PVD, CVD, PE-CVD, ALD, etc.).

Figure 7D:
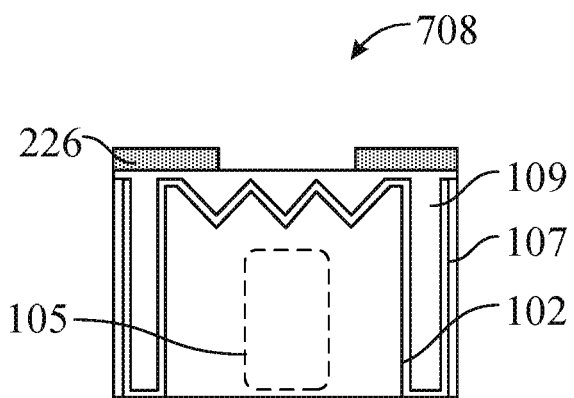

FIG. 7D shows another cross-sectional view 708 of a portion of an image sensor integrated chip. As shown in cross-sectional view 708, reflective elements 226 are formed over the first dielectric 109. In some embodiments, the reflective element 226 may be deposited by a physical vapor deposition technique (e.g., PVD, CVD, PE-CVD, ALD, etc.). In another embodiment, the reflective elements 226 can have a thickness ranging from approximately 300 angstroms to approximately 5,000 angstroms.

In an embodiment, the reflective elements 226 can cover a portion of the plurality of recesses 214. In another embodiment, the reflective elements 226 may comprise one or more reflective regions. The one or more reflective regions may comprise materials selected to provide for a good QE at different wavelengths of electromagnetic radiation. In some embodiments, the one or more reflective regions may comprise one or more reflective filler materials. The one or more reflective filler materials may comprise metals such as aluminum (Al), rhodium (Rh), ruthenium (Ru), copper (Cu), silver (Ag), gold (Au), tungsten (W), cobalt (Co), iron (Fe), molybdenum (Mo), titanium (Ti), chromium (Cr).

Figure 7E:
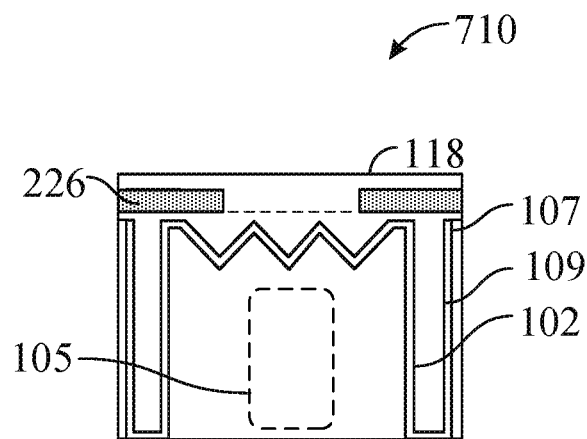

FIG. 7E shows another cross-sectional view 710 of a portion of an image sensor integrated chip. As shown in cross-sectional view 710, a second dielectric 118 is formed over the first dielectric 109 and the reflective elements 226. In another embodiment, the second dielectric 118 can include an oxide (e.g., silicon oxide), TEOS, etc. In some embodiments, the second dielectric 118 may undergo a subsequent planarization process (e.g., a chemical mechanical planarization process) to form a substantially planar surface.

Figure 7F:
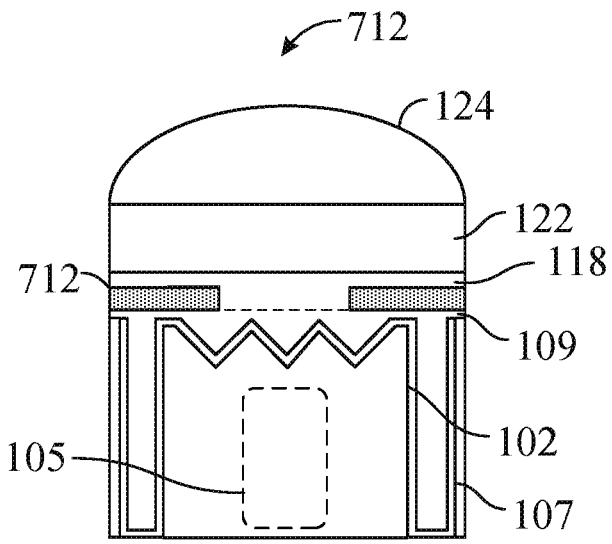

FIG. 7F shows another cross-sectional view 712 of a portion of an image sensor integrated chip. As shown in cross-sectional view 712, a color filter 122 is formed over the second dielectric 118. The color filter 122 is formed of a material that allows for the transmission of radiation (e.g., light) having a specific range of wavelength, while blocking light of wavelengths outside of the specified range. A micro-lens 124 may be formed over the color filter 122.

FIGS. 8A-8G illustrate cross-sectional views of some embodiments of a method of forming an image sensor integrated chip with reduced backscattering of incident light.

Figure 8A:
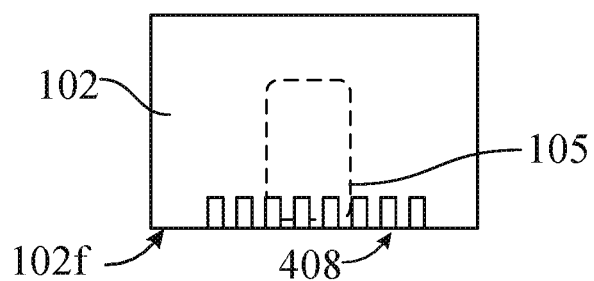

FIG. 8A shows another cross-sectional view 802 of a portion of an image sensor integrated chip. As shown in cross-sectional view 802, the portion of the image sensor integrated chip can include a substrate 102. The substrate 102 can include a silicon material or another semi-conductor material. In some embodiments, the substrate 102 may be thinned to allow for radiation to pass more easily to image sensing elements within the substrate 102. In various embodiments, the substrate 102 may be thinned by etching and/or mechanical grinding the substrate 102.

In an embodiment, a plurality of STI structures 408 may be formed along a first side 102f of the substrate 102. In an embodiment, the plurality of STI structure 408 can serve as a diffuser on the first side 102f of the substrate 102. In some embodiments, the plurality of STI structures 408 may be formed by selectively etching the first side 102f of the substrate 102 to form shallow trenches and subsequently forming one or more dielectric materials within the shallow trenches. In some embodiments, the etching process may comprise a dry etching process. For example, the etching process may comprise a coupled plasma etching process, such as an inductively coupled plasma (ICP) etching process or a capacitively coupled plasma (CCP) etching process. In other embodiments, the etching process may comprise a wet etching process.

Additionally, image sensing elements 105 can be formed within pixel regions of the substrate 102. In some embodiments, the image sensing elements 105 may comprise photodiodes formed by implanting one or more dopant species into a first side 102f of the substrate 102. In some embodiments, the plurality of STI structures 408 may be formed prior to formation of one or more transistor gate structures and/or image sensing elements 105.

Figure 8B:
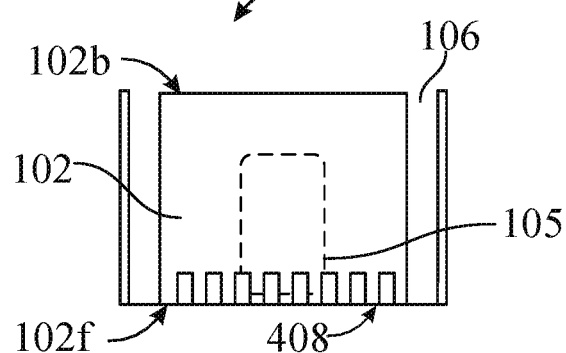

FIG. 8B shows another cross-sectional view 804 of a portion of an image sensor integrated chip. As shown in cross-sectional view 804, trenches 106 may be formed within a second side 102b of the substrate 102. One or more etchants can be used to remove parts of the substrate 102 to define the trenches 106. In some embodiments, the etching process may comprise a dry etching process. For example, the etching process may comprise a coupled plasma etching process, such as an inductively coupled plasma (ICP) etching process or a capacitively coupled plasma (CCP) etching process. In other embodiments, the etching process may comprise a wet etching process. In an embodiment, the trenches 106 can be formed on respective sides of a pixel region.

Figure 8C:
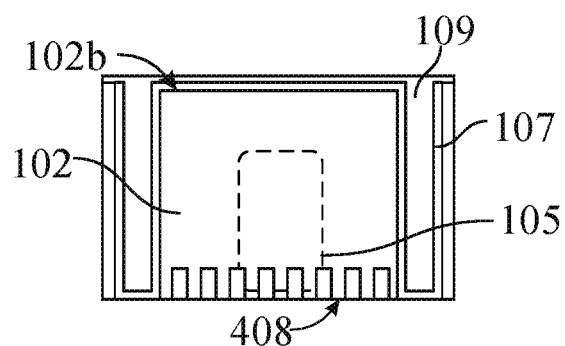

FIG. 8C shows another cross-sectional view 806 of a portion of an image sensor integrated chip. As shown in cross-sectional view 806, a first dielectric 109 may be formed within the trenches 106. In another embodiment, the first dielectric 109 can include an oxide (e.g., silicon oxide), TEOS, etc. In some embodiments, the first dielectric 109 may fill the trenches 106. The first dielectric 109 may undergo a subsequent planarization process (e.g., a chemical mechanical planarization process) to form a substantially planar surface.

In another embodiment, one or more absorption enhancement layers 107 may be formed along the second side 102b of the substrate 102. The one or more absorption enhancement layers 107 line the second side 102b of the substrate 102. In some embodiments, the anti-reflective material may further line interior surfaces of the trenches 106. In another embodiment, the one or more absorption enhancement layers 107 can include an anti-reflective coating material. In some embodiments, the anti-reflective material may comprise a high-k dielectric material deposited by a physical vapor deposition technique (e.g., PVD, CVD, PE-CVD, ALD, etc.).

Figure 8D:
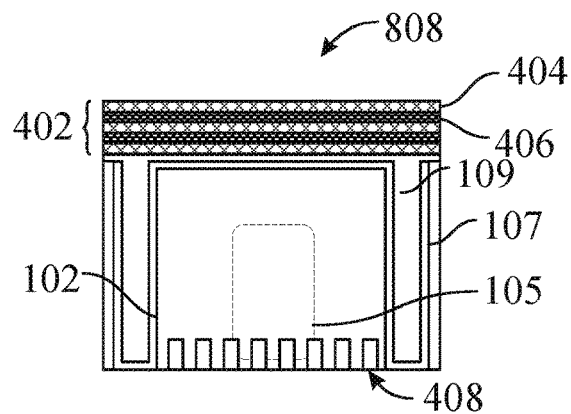

FIG. 8D shows another cross-sectional view 808 of a portion of an image sensor integrated chip. As shown in cross-sectional view 808, a multi-layer structure 402 is formed over the first dielectric 109. The multi-layer structure 402 may comprise a plurality of stacked dielectric layers. In various embodiments, the plurality of stacked dielectric layers may comprise one or more of an oxide (e.g., $SiO_2$, SiCO, etc.), a fluorosilicate glass, a phosphate glass (e.g., borophosphate silicate glass), etc.

In another embodiment, the multi-layer structure 402 can have angular selectivity, with respect to the incident radiation, for example, near-infrared radiation (NIR). For example, the multi-layer structure 402 may allow radiation traveling towards the substrate 102 to pass through the multi-layer structure 402 over a first range of angles, and to further allow radiation traveling away from the substrate 102 to pass through the multi-layer structure 402 over a second range of angles that is different than the first range of angles.

In an embodiment, the multi-layer structure 402 can include a first material 404 and a second material 406. In one embodiment, the first material 404 can include a dielectric material having a relatively high index of refraction, with respect to the second material 406. In another embodiment, the second material 406 can include a dielectric material having a lower index of refraction with respect to the first material 404. In an embodiment, the first material 404 can include a titanium oxide material. In another embodiment, the second material 406 can include a second oxide material, for example a silicon oxide material. In one embodiment, the multi-layer structure 402 can have a thickness ranging between approximately 1,000 angstroms to approximately 10,000 angstroms. In some embodiments, the multi-layer structure 402 may be deposited by a physical vapor deposition technique (e.g., PVD, CVD, PE-CVD, ALD, etc.).

Figure 8E:
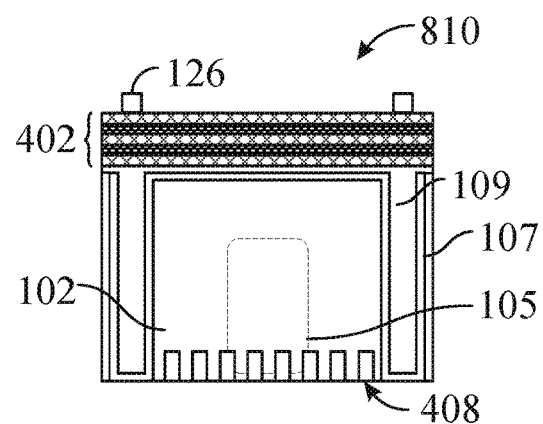

FIG. 8E shows another cross-sectional view 810 of a portion of an image sensor integrated chip. As shown in cross-sectional view 810, grid elements 126 are formed over the multi-layer structure 402. In another embodiment, the grid elements 126 can include a metal (e.g., aluminum, cobalt, copper, silver, gold, tungsten, etc.) and/or a dielectric material (e.g., $SiO_2$, SiN, etc.). In some embodiments, the grid elements 126 may be deposited by a physical vapor deposition technique (e.g., PVD, CVD, PE-CVD, ALD, etc.).

Figure 8F:
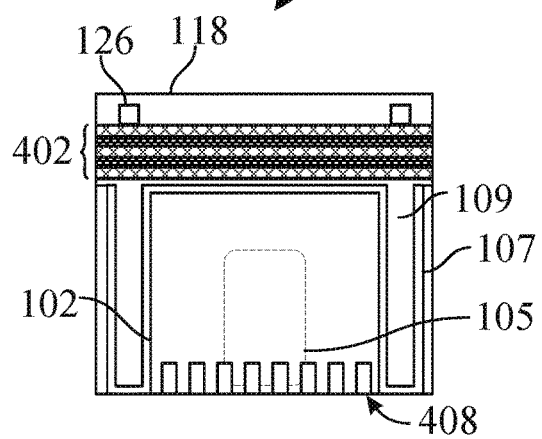

FIG. 8F shows another cross-sectional view 812 of a portion of an image sensor integrated chip. As shown in cross-sectional view 812, a second dielectric 118 is formed over the multi-layer structure 402 and the grid elements 126. In another embodiment, the second dielectric 118 can include an oxide (e.g., silicon oxide), TEOS, etc. In some embodiments, the second dielectric 118 may undergo a subsequent planarization process (e.g., a chemical mechanical planarization process) to form a substantially planar surface.

Figure 8G:
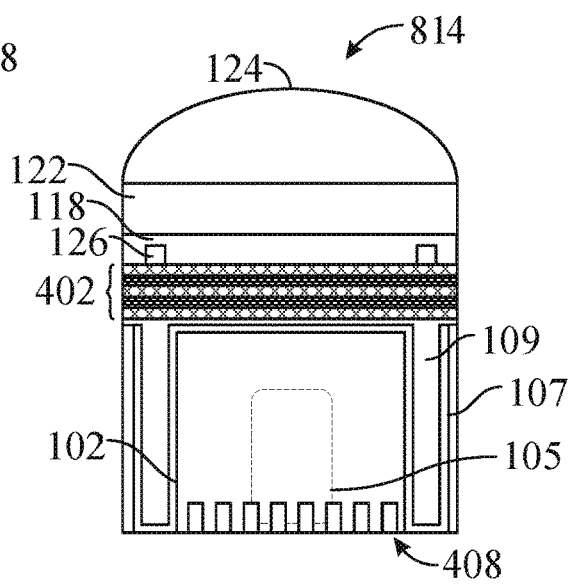

FIG. 8G shows another cross-sectional view 814 of a portion of an image sensor integrated chip. As shown in cross-sectional view 814, a color filter 122 is formed over the second dielectric 118. The color filter 122 can also be formed over the second dielectric 118. The color filter 122 is formed of a material that allows for the transmission of radiation (e.g., light) having a specific range of wavelength, while blocking light of wavelengths outside of the specified range. A micro-lens 124 may be formed over the color filter 122.

Figure 9:
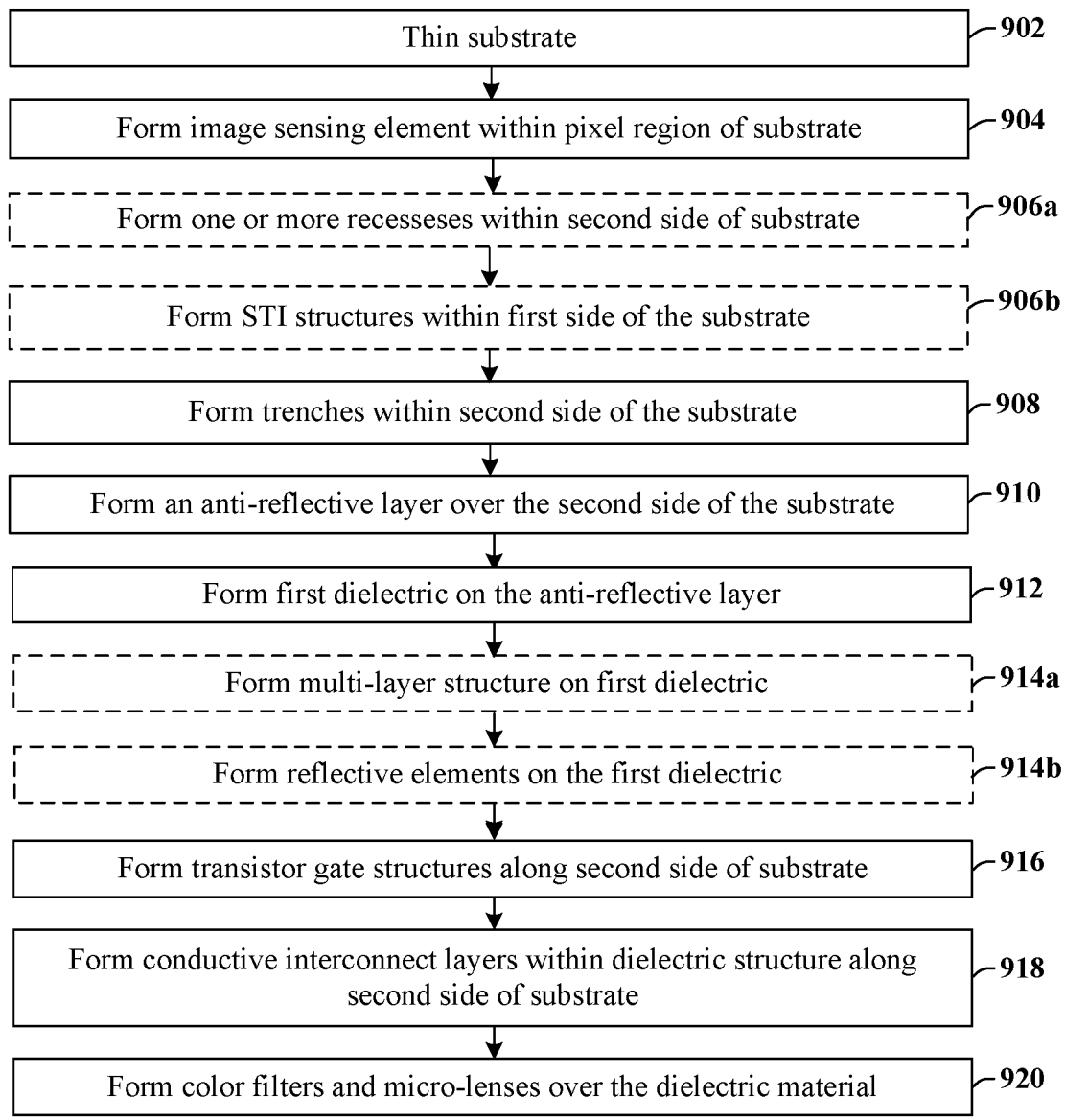
FIG. 9 illustrates a flow diagram of some embodiments of a method of forming an image sensor integrated chip as disclosed herein.

FIG. 9 illustrates a flow diagram of some embodiments of a method 900 of forming an image sensor integrated chip as disclosed herein.

While method 900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, a substrate is thinned to reduce a thickness of the substrate. FIGS. 5A, 6A, 7A, and 8A illustrate cross-sectional views of some embodiments corresponding to act 902.

At 904, an image sensing element is formed within a pixel region of a substrate. FIGS. 5B, 6B, 7B, and 8A illustrate cross-sectional views of some embodiments corresponding to act 904.

At 906a, one or more recesses are formed within a second side of the substrate. In some embodiments, the plurality of recesses may be formed by selectively etching the second side of the substrate according to a patterned masking layer. FIGS. 5B, 6B, and 7B illustrate cross-sectional views of some embodiments corresponding to act 906a.

Optionally, at 906b, a plurality of STI structures can be formed within a first side of the substrate. In some embodiments, the plurality of STI structures may be formed by selectively etching the first side of the substrate according to a patterned masking layer. FIG. 8A illustrates cross-sectional views of some embodiments corresponding to act 906b.

At 908, a plurality of trenches are formed within the second side of the substrate. In some embodiments, the trenches are formed by selectively etching the second side of the substrate, for example, according to a second masking layer. FIGS. 5B, 6B, 7B, and 8B illustrate cross-sectional views of some embodiments corresponding to act 908.

At 910, an anti-reflective layer is formed over the second side of the substrate. In some embodiments, the anti-reflective layer may also be formed within the plurality of trenches. FIGS. 5C, 6C, 7C, and 8C illustrate cross-sectional views of some embodiments corresponding to act 910.

At 912, a first dielectric is formed on the anti-reflective layer. FIGS. 5C, 6C, 7C, and 8C illustrate cross-sectional views of some embodiments corresponding to act 912.

Optionally, at 914a, a multi-layer structure can be formed on a backside of the substrate, on the dielectric material. In some embodiments, the multi-layer structure may be formed sequentially depositing additional dielectric layers on the dielectric material. FIG. 8D illustrates cross-sectional views of some embodiments corresponding to act 914a.

Optionally, at 914b, reflective elements are formed on the first dielectric. In some embodiments, the reflective elements can cover a portion of the recesses and/or protrusions of the substrate. FIGS. 6F and 7E illustrate cross-sectional views of some embodiments corresponding to act 914b.

At 916, one or more transistor gate structures are formed along a second side of the substrate over the pixel region.

At 918, a plurality of conductive interconnect layers are formed within a dielectric structure along the second side of the substrate.

At 920, color filters and micro-lenses are formed over the layer of dielectric material. FIGS. 5F, 6G, 7F, 8G illustrates cross-sectional views of some embodiments corresponding to act 920.

Accordingly, the present disclosure relates to an image sensor integrated chip comprising an internal reflection enhancement structure configured to reduce backscattered light from a pixel.

In some embodiments, the present disclosure relates to an image sensor integrated chip. The image sensor integrated chip includes an image sensing element arranged within a pixel region of a substrate. A first dielectric is disposed in trenches within a first side of the substrate. The trenches are defined by first sidewalls disposed on opposing sides of the pixel region. An internal reflection structure arranged along a first side of the substrate and is configured to reflect radiation exiting from the substrate back into the substrate.

In other embodiments, the present disclosure relates to an image sensor integrated chip. The image sensor integrated chip includes a substrate having a front-side and a back-side. The back-side of the substrate is configured to receive incident radiation propagating in a first direction prior to the incident radiation reaching front-side of the substrate. An image sensing element is arranged within a pixel region of the substrate, and a plurality of conductive interconnect layers are arranged within a dielectric structure disposed along the front-side of the substrate. An internal reflection structure is arranged along the back-side of the substrate and is configured to reflect radiation that is propagating in a second direction opposite the first direction.

In some embodiments, the present disclosure relates to a method of forming an image sensor integrated chip. The method includes forming an image sensing element within a substrate. The method further includes forming an internal reflection structure along a back-side of the substrate. The internal reflection structure is configured to reflect radiation exiting from the substrate back into the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   an image sensor within a substrate;
   a first dielectric having an upper surface extending over a first surface of the substrate and over one or more trenches within the first surface of the substrate, wherein the one or more trenches laterally surround the image sensor; and
   a reflective structure arranged over the upper surface of the first dielectric, wherein the reflective structure is configured to reflect radiation exiting from the substrate back into the substrate,
   wherein the substrate comprises internal surfaces defining one or more recesses disposed over the image sensor, and
   wherein the reflective structure partially laterally overlaps the one or more recesses.

2. The integrated chip of claim 1, wherein the reflective structure comprises a bottom surface facing the substrate and a top surface facing away from the substrate, the bottom surface having a greater width than the top surface.

3. The integrated chip of claim 1, wherein the reflective structure comprises sidewalls extending between a bottom surface of the reflective structure and a top surface of the reflective structure, the sidewalls arranged laterally between the one or more trenches.

4. The integrated chip of claim 1, further comprising:
   a second dielectric arranged over the upper surface of the first dielectric; and
   a grid disposed within the second dielectric, the grid vertically offset from the reflective structure.

5. The integrated chip of claim 4, wherein the grid is disposed vertically between the reflective structure and the substrate.

6. The integrated chip of claim 4, wherein the reflective structure is disposed vertically between the grid and the substrate.

7. The integrated chip of claim 1,
   wherein the first surface of the substrate is a substantially flat surface extending between the one or more recesses and the one or more trenches, the substantially flat surface surrounding the one or more recesses.

8. The integrated chip of claim 1, wherein the reflective structure comprises:
   a first material having a first refractive index;
   a second material having a second refractive index greater than the first refractive index; and
   a third material having a third refractive index that is less than the second refractive index, wherein the second material has a bottommost surface contacting a topmost surface of the first material and the second material has a topmost surface contacting a bottommost surface of the third material.

9. The integrated chip of claim 1, further comprising:
a color filter disposed over the substrate, wherein the reflective structure is arranged between the color filter and the first surface of the substrate.

10. The integrated chip of claim 1, further comprising:
a color filter disposed over the substrate, wherein the reflective structure has a first height that is substantially equal to a second height of the color filter.

11. The integrated chip of claim 1, wherein the reflective structure comprises a material having a first index of refraction that is less than a second index of refraction of the first dielectric.

12. An integrated chip, comprising:
an image sensor within a substrate, wherein the substrate comprises internal surfaces defining one or more recesses directly over the image sensor;
a first dielectric disposed within one or more trenches within the substrate, wherein the one or more trenches laterally surround the one or more recesses; and
wherein the substrate comprises a substantially flat surface extending between the one or more recesses and the one or more trenches, the substantially flat surface continuously extending in an unbroken path around the one or more recesses.

13. The integrated chip of claim 12, further comprising:
a second dielectric disposed over the substantially flat surface of the substrate and laterally surrounding a grid; and
a reflective structure disposed over the substantially flat surface and vertically offset from the grid.

14. The integrated chip of claim 12, further comprising:
a reflective structure continuously extending from directly over the image sensor to past opposing sides of the image sensor.

15. The integrated chip of claim 14, wherein the reflective structure comprises sidewalls extending between a bottom surface of the reflective structure and a top surface of the reflective structure, the sidewalls defining an aperture that is directly over the image sensor.

16. The integrated chip of claim 12, wherein the internal surfaces of the substrate define a plurality of recesses arranged in rows extending along a first direction and in columns extending along a second direction that is perpendicular to the first direction as viewed from a top-view of the substrate, the first dielectric arranged within the plurality of recesses.

17. An integrated chip, comprising:
an image sensing element arranged within a substrate;
a first dielectric disposed in one or more first trenches extending from a first side of the substrate, wherein the one or more first trenches are defined by first sidewalls of the substrate that laterally surround the image sensing element; and
a second dielectric disposed in a plurality of second trenches extending from a second side of the substrate opposing the first side, the plurality of second trenches are defined by second sidewalls of the substrate that are laterally between the first sidewalls defining the one or more first trenches, wherein the plurality of second trenches are laterally separated from the plurality of first trenches and vertically below the image sensing element.

18. The integrated chip of claim 17, further comprising:
a gate structure disposed directly below one or more of the plurality of second trenches within the second side of the substrate.

19. The integrated chip of claim 17, further comprising:
a multi-film reflector disposed over the first side of the substrate and laterally extending between the first sidewalls, wherein the multi-film reflector alternates between multiple layers of a first material having a first refractive index and multiple layers of a second material contacting the first material and having a second refractive index greater than the first refractive index.

20. The integrated chip of claim 17, wherein the plurality of second trenches are disposed directly below the image sensing element.

* * * * *

UNITED STATES PATENT AND TRADEMARK OFFICE
CERTIFICATE OF CORRECTION

| | | |
|---|---|---|
| PATENT NO. | : 11,158,662 B2 | |
| APPLICATION NO. | : 16/695575 | |
| DATED | : October 26, 2021 | |
| INVENTOR(S) | : Keng-Yu Chou et al. | |

It is certified that error appears in the above-identified patent and that said Letters Patent is hereby corrected as shown below:

In the Claims

Line 30, Claim 1; insert --has a bottommost surface that faces the substrate and that-- in between the words "structure" and "partially"

Line 33, Claim 2: replace [[a bottom surface facing the substrate and]] with a metal having Line 34, Claim 2: insert --; and wherein the bottommost surface of the reflective structure is a bottommost surface of the metal-- after "substrate"

Line 34, Claim 2: replace [[bottom]] with bottommost

Line 35, Claim 2: insert --of the metal-- after the first instance of "surface"

Lines 36-40, Claim 3: replace [[reflective structure comprises sidewalls extending between a bottom surface of the reflective structure and a top surface of the reflective structure, the sidewalls arranged laterally between the one or more trenches]] with substrate comprises a substantially flat surface extending between the one or more recesses and the one or more trenches, the reflective structure completely covering the substantially flat surface Lines 25-30, Claim 13: replace [[further comprising: a second dielectric disposed over the substantially flat surface of the substrate and laterally surrounding a grid; and a reflective structure disposed over the substantially flat surface and vertically offset from the grid]] with wherein the one or more trenches extend into the substrate to a greater depth than the one or more recesses Lines 32-34, Claim 14: replace [[continuously extending from directly over the image sensor to past opposing sides of the image sensor]] with completely covering the substantially flat surface of the substrate Line 21, Claim 17: replace [[plurality of]] with one or more Signed and Sealed this
Second Day of August, 2022

Katherine Kelly Vidal
*Director of the United States Patent and Trademark Office*

CERTIFICATE OF CORRECTION (continued)
U.S. Pat. No. 11,158,662 B2

Line 22, Claim 17: insert --, vertically overlap the one or more first trenches,-- after "trenches"

Line 22, Claim 17: insert --are-- after "and"

Line 29, Claim 19: insert --completely-- after "disposed"

Lines 36-38, Claim 20: replace [[wherein the plurality of second trenches are disposed directly below the image sensing element]] with having a plurality of stacked layers covering one another, the multi-film reflector having a bottommost surface that is over the first side of the substrate